(12) United States Patent
Fujii

(10) Patent No.: US 7,759,145 B2
(45) Date of Patent: Jul. 20, 2010

(54) PROCESS FOR PRODUCING LIGHT-EMITTING DIODE ELEMENT EMITTING WHITE LIGHT

(75) Inventor: Takehiro Fujii, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1168 days.

(21) Appl. No.: 10/559,497

(22) PCT Filed: May 27, 2004

(86) PCT No.: PCT/JP2004/007261

§ 371 (c)(1),
(2), (4) Date: Dec. 6, 2005

(87) PCT Pub. No.: WO2004/112154

PCT Pub. Date: Dec. 23, 2004

(65) Prior Publication Data

US 2006/0118510 A1 Jun. 8, 2006

(30) Foreign Application Priority Data

Jun. 13, 2003 (JP) ................................ 2003-169701

(51) Int. Cl.
*H01L 21/00* (2006.01)
(52) U.S. Cl. ............................ 438/26; 438/33; 438/113; 438/126; 438/127
(58) Field of Classification Search ................... 438/26, 438/33, 113, 126, 127
See application file for complete search history.

(56) References Cited

U.S. PATENT DOCUMENTS 6,468,821 B2  10/2002  Maeda et al.

| 2002/0123164 A1* | 9/2002 | Slater et al. .................. 438/39 |
| 2003/0190770 A1* | 10/2003 | Yeom et al. .................. 438/113 |
| 2004/0032013 A1* | 2/2004 | Cobbley et al. .............. 257/678 |
| 2004/0056260 A1* | 3/2004 | Slater et al. .................. 257/79 |

FOREIGN PATENT DOCUMENTS

| JP | 57-4180 | 1/1982 |
| JP | 2-290084 | 11/1990 |
| JP | 11-317546 | 11/1999 |
| JP | 2000-208822 | 7/2000 |
| JP | 2001-68743 | 3/2001 |
| JP | 2002-261325 | 9/2002 |

* cited by examiner

*Primary Examiner*—N. Drew Richards
*Assistant Examiner*—Jae Lee
(74) *Attorney, Agent, or Firm*—Hamre, Schumann, Mueller & Larson, P.C.

(57) ABSTRACT

An object of the present invention is to manufacture a white light-emitting diode element by coating a blue light-emitting diode chip with a coating of a synthetic resin containing a fluorescent material.

The object is achieved by bonding an LED material plate corresponding to a plurality of LED chips to an expansion sheet, dividing the LED material plate into individual LED chips, stretching the expansion sheet to widen the spacing between the LED chips, forming a synthetic resin layer between the chips, and dicing the synthetic resin layer to remove portions of the synthetic resin layer between the LED chips while leaving part of the synthetic resin layer on a side surface of each of the LED chips.

4 Claims, 10 Drawing Sheets

PROCESS FOR PRODUCING LIGHT-EMITTING DIODE ELEMENT EMITTING WHITE LIGHT

TECHNICAL FIELD

The present invention relates to a method for manufacturing a light-emitting diode element using a light-emitting diode chip, and particularly to a method for manufacturing a light-emitting diode element that emits white light.

BACKGROUND ART

Recently, InGaN-based, blue light-emitting diode chips have been developed, and it is well known that such blue light-emitting diode chips exhibit high light emission brightness.

Such a blue light-emitting diode chip can be utilized for producing white light by coating the surface of the chip with a light-pervious synthetic resin containing a fluorescent material. In this manner, part of the blue light emission is converted into yellow light by the fluorescent material in the coating, and their mixture results in the white light.

In the case where the blue light emitted from a blue light-emitting diode chip is subjected to wavelength conversion for white light emission by coating the chip with a coating of a light-pervious synthetic resin containing a fluorescent material, the degree of the wavelength conversion largely depends on the thickness of the coating. For instance, when the thickness of the coating is relatively large, the ratio of wavelength conversion into yellow green becomes high so that a yellow green tone becomes strong. When the thickness of the coating is relatively small, the ratio of wavelength conversion of blue light becomes low, so that a blue tone becomes strong. Therefore, it is necessary to make the thickness of the coating generally uniform with respect to a plurality of LED chips and to make the surface of the coating smooth and flat.

In the above-described structure, the tone of the white light can be changed by changing the thickness of the coating.

JP-A-2000-208822 as a prior art discloses some methods for coating a blue light-emitting diode chip with a light-pervious synthetic resin containing a fluorescent material. According to the methods:

(1) A plurality of LED chips are mounted on the upper surface of a substrate at a pitch which allows the formation of a predetermined coating on side surfaces of the LED chips, and then a light-pervious synthetic resin layer containing a fluorescent material is formed on the upper surface of the substrate to embed the LED chips in the synthetic resin layer, and then portions of the synthetic resin layer between the LED chips are removed by photolithography (a technique which performs printing by light exposure using a pattern mask and developing);

(2) A plurality of LED chips are mounted on the upper surface of a substrate at a pitch which allows the formation of a predetermined coating on side surfaces of the LED chips, and then a light-pervious synthetic resin containing a fluorescent material is applied to each of the LED chips by screen printing using a mask to coat the LED chip with the synthetic resin;

(3) A plurality of LED chips are mounted on the upper surface of a substrate at a pitch which allows the formation of a predetermined coating on side surfaces of the LED chips, and then a light-pervious synthetic resin layer containing a fluorescent material is formed on the upper surface of the substrate to embed the LED chips in the synthetic resin layer, and then the substrate and the synthetic resin layer are diced into individual LED chips.

In the above-described prior art methods (1) and (2), to change the thickness of the coating to achieve an intended white tone in the light emission, the pattern mask for photolithography or the mask for screen printing need be replaced with one having a pattern pitch capable of achieving an intended thickness.

Therefore, as the pattern mask for photolithography or the mask for screen printing, different kinds of masks need be prepared depending on the number of intended tones, which costs much and results in considerable increase in the manufacturing cost.

Further, by the photolithography of the method (1) and the screen printing of the method (2), irregularities are inevitably formed at the surface of the coating covering the LED chip, and the surface cannot be made a smooth flat surface. Therefore, the tone of the light becomes non-uniform.

In the method (3) of the prior art, the surface of the coating is provided by dicing, so that a smooth flat surface can be provided. In this method, however, to change the thickness to change the tone, the spacing distance between the LED chips need be changed in mounting the LED chips on the substrate. Therefore, changing of the tone is extremely troublesome and requires much cost.

Patent Document 1: JP-A-2000-208822.

DISCLOSURE OF THE INVENTION

Problems to be Solved by the Invention

An object of the present invention is to provide a manufacturing method which is capable of solving the above-described problems.

Means for Solving the Problems

To achieve the above object, the method according to claim 1 of the present invention comprises the step of: preparing an integral LED material plate corresponding to a plurality of LED chips each of which includes an anode and a cathode electrodes for a blue light-emitting layer, the anode electrode and the cathode electrode being provided at opposite end surfaces of the LED chip respectively; bonding the LED material plate to an upper surface of an expansion sheet so that at least either of the cathode electrode and the anode electrode comes into close contact with the expansion sheet; dicing the LED material plate into individual LED chips while the LED material plate is bonded to the expansion sheet; stretching the expansion sheet in two directions which are perpendicular to each other along a surface so that the spacing between adjacent LED chips is widened; forming a light-pervious synthetic resin layer containing a fluorescent material on the upper surface of the expansion sheet so that each of the LED chips is embedded in the synthetic resin layer up to the electrode on an upper surface of the LED chip; dicing the synthetic resin layer to remove portions of the synthetic resin layer between adjacent LED chips by a cutting width which is smaller than the spacing distance between side surfaces of adjacent LED chips; and finally detaching the LED chips from the expansion sheet.

According to claim 2 of the present invention, the dicing of the LED material plate into individual LED chips comprises forming an inclined surface at a side surface of each of the LED chips, the inclined surface being inclined from one electrode film toward the other electrode film.

According to claim 3 of the present invention, each of the LED chips includes a light reflective layer on an upper side of the light-emitting layer.

The method according to claim 4 of the present invention comprises the step of: preparing an integral LED material plate corresponding to a plurality of LED chips each of which includes an anode and a cathode electrodes for a blue light-emitting layer, the anode electrode and the cathode electrode being provided at an end surface of the LED chip; bonding the LED material plate to an upper surface of an expansion sheet so that the cathode electrode and the anode electrode come into close contact with the expansion sheet; dicing the LED material plate into individual LED chips while the LED material plate is bonded to the expansion sheet; stretching the expansion sheet in two directions which are perpendicular to each other along a surface so that a spacing between adjacent LED chips is widened; forming a light-pervious synthetic resin layer containing a fluorescent material on the upper surface of the expansion sheet so that each of the LED chips is embedded in the synthetic resin layer at least up to a side surface; dicing the synthetic resin layer to remove portions of the synthetic resin layer between adjacent LED chips by a cutting width which is smaller than the spacing distance between side surfaces of adjacent LED chips; and finally detaching the LED chips from the expansion sheet.

Advantages of the Invention

According to the present invention, an integral LED material plate corresponding to a plurality of LED chips is bonded to the upper surface of an expansion sheet so that either one or both of the cathode electrode and anode electrode of each LED chip of the LED material plate come into close contact with the expansion sheet. After the LED material plate in this state is diced into individual LED chips, the expansion sheet is stretched in two directions which are perpendicular to each other along a surface, whereby the spacing between adjacent LED chips is widened. With such a method, a pitch distance which allows the formation of a predetermined coating on a side surface of each LED chip can be secured between adjacent LED chips.

Subsequently, after a light-pervious synthetic resin layer containing a fluorescent material is formed on the upper surface of the expansion sheet, the synthetic resin layer is diced to remove portions of the synthetic resin between the LED chips by a cutting width which is smaller than the spacing distance between side surfaces of adjacent LED chips. As a result, the light-pervious synthetic resin containing a fluorescent material remains on the side surfaces of the LED chips. In this way, the side surfaces of each LED chip or the entirety of the chip can be coated with a coating of light-pervious synthetic resin containing a fluorescent material. Further, with such a method, the surface of the coating can be made smooth and flat by dicing, and the thickness of the coating can be made generally uniform with respect to a plurality of LED chips.

By finally detaching the LED chips from the expansion sheet, either one or both of the cathode electrode and the anode electrode of each LED chip are reliably exposed. Electrical connection of a wiring pattern or a metal wire from the outside to the exposed electrode can be performed easily and reliably.

In stretching the expansion sheet in two directions which are perpendicular to each other, the stretching dimension in the two directions may be appropriately changed to increase or decrease the spacing between adjacent LED chips and hence to increase or decrease the thickness of the synthetic resin which remains on the side surfaces of LED chips. In this way, the thickness of the coating on each LED chip can be changed as desired.

Alternatively, in dicing the synthetic resin layer at portions between LED chips, the cutting width in dicing can be appropriately changed to increase or decrease the thickness of the synthetic resin remaining on the side surfaces of LED chips. With such a method again, the thickness of the coating on each LED chip can be changed as desired.

Alternatively, the changing of the thickness of the coating can be performed by the combination of an appropriate increase or decrease of the stretching dimension in stretching the expansion sheet in two directions and an appropriate increase or decrease of the cutting width in dicing the synthetic resin layer at portions between LED chips.

In this way, according to the present invention, change of the tone of light by increasing or decreasing the thickness of the coating on each LED chip can be performed more easily and accurately than in the prior art method, and the cost for changing the tone of light can be considerably reduced.

Particularly, by employing the structure as set forth in claim 2, the light from the light-emitting layer of the LED chip can be emitted from the inclined surface provided at a side surface of the LED chip without significant attenuation, whereby the light emission brightness can be advantageously enhanced.

An increase in amount of light emitted from a side surface can be realized also by employing the structure as set forth in claim 3.

Figure 1:
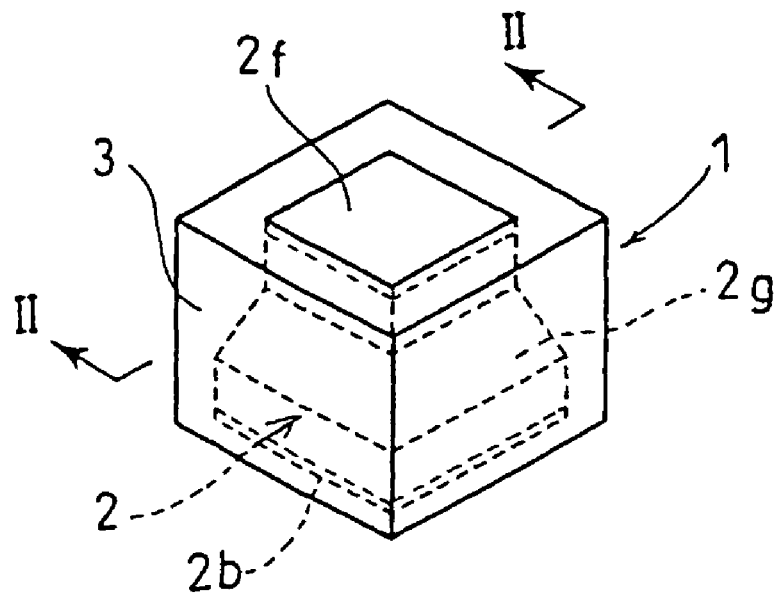
FIG. 1 is a perspective view showing an LED according to a first embodiment of the present invention.

DESCRIPTION OF SIGNS 1, 1' LED element
2, 2' LED chip
2a, 2a' substrate of LED chip
2d, 2d' light-emitting layer of LED chip
2b, 2b' cathode electrode of LED chip
2f, 2f' anode electrode of LED chip
3, 3' coating
A, A' LED material plate
A1, A1' cutting line
B, B' expansion sheet
C, C' synthetic resin layer Best Mode for Carrying Out the Invention Preferred embodiments of the present invention will be described below with reference to the accompanying drawings.

FIGS. 1-14 show a first embodiment of the present invention.

Figure 2:
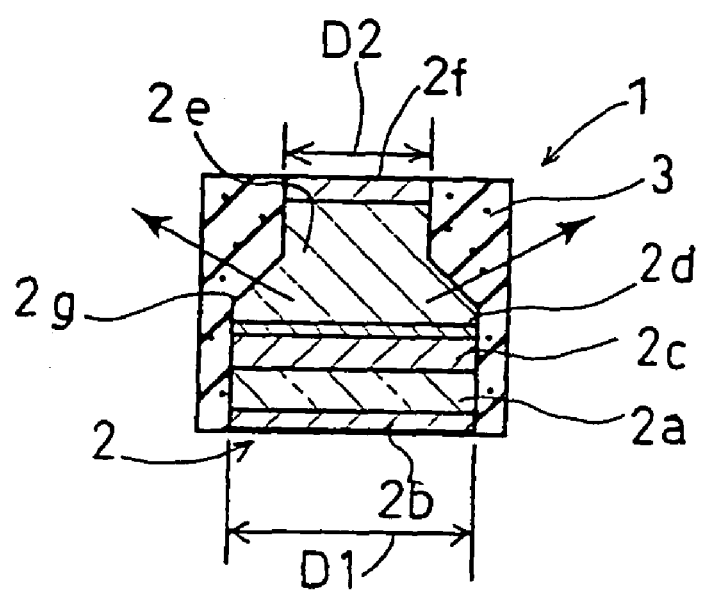
FIG. 2 is a sectional view taken along lines II-II in FIG. 1.

Of these figures, FIGS. 1 and 2 show an LED element 1 to be manufactured in the first embodiment.

The LED element 1 includes an LED chip 2, and a coating 3 made of a light-pervious synthetic resin containing a fluorescent material and covering the side surfaces of the LED chip 2. The LED chip 2 includes opposite end surfaces at which an anode electrode $2f$ and a cathode electrode $2b$ are provided, respectively, which are exposed without being coated with the coating 3.

As is conventionally known, the LED chip 2 includes at least a substrate $2a$ having a lower surface on which the cathode electrode $2b$ is provided, and an upper surface on which an n-type semiconductor layer $2c$, a light-emitting layer $2d$ for emitting blue light, a p-type semiconductor layer $2e$ and the anode electrode $2f$ are stacked.

In the LED element 1 having the above structure, since the side surfaces of the LED chip 2 are coated with the coating 3 made of a light-pervious synthetic resin containing a fluorescent material, the blue light emitted from the light-emitting layer $2d$ of the LED chip 2 is subjected to wavelength conversion by the fluorescent material in the coating and emitted to the outside as white light.

Of the side surfaces of the LED chip 2, at least the side surface of the p-type semiconductor layer $2e$ includes an inclined surface $2g$ which is inclined inward toward the anode electrode $2f$ so that the dimension D2 of the anode electrode $2f$ is small relative to the dimension D1 of the substrate $2a$, cathode electrode $2b$, n-type semiconductor layer $2c$ and light-emitting layer $2d$. With such a structure, while securing the relatively wide area of the light-emitting layer $2d$, the light from the light-emitting layer $2d$ can be emitted to the outside through the inwardly inclined side surface $2g$ without significant attenuation. Therefore, the amount of white light emission can be increased.

Further, in the LED chip 2, a light reflective layer such as a DBR (Distributed Bragg Reflector) layer may be provided on the upper side of the light-emitting layer $2d$. In such a case, the amount of light emitted upward from the upper surface of the LED chip 2 can be reduced, whereby the amount of light emitted from side surfaces of the LED chip can be increased.

The LED element 1 having the above structure is manufactured by a method described below.

First, an integral LED material plate A is prepared which corresponds to a plurality of LED chips 2 having the above-described structure.

The LED material plate A is prepared by successively forming a cathode electrode $2b$, an n-type semiconductor layer $2c$, a light-emitting layer $2d$, a p-type semiconductor layer $2e$ and an anode electrode $2f$ on a silicon wafer as a substrate $2a$ by an appropriate method.

Figure 3:
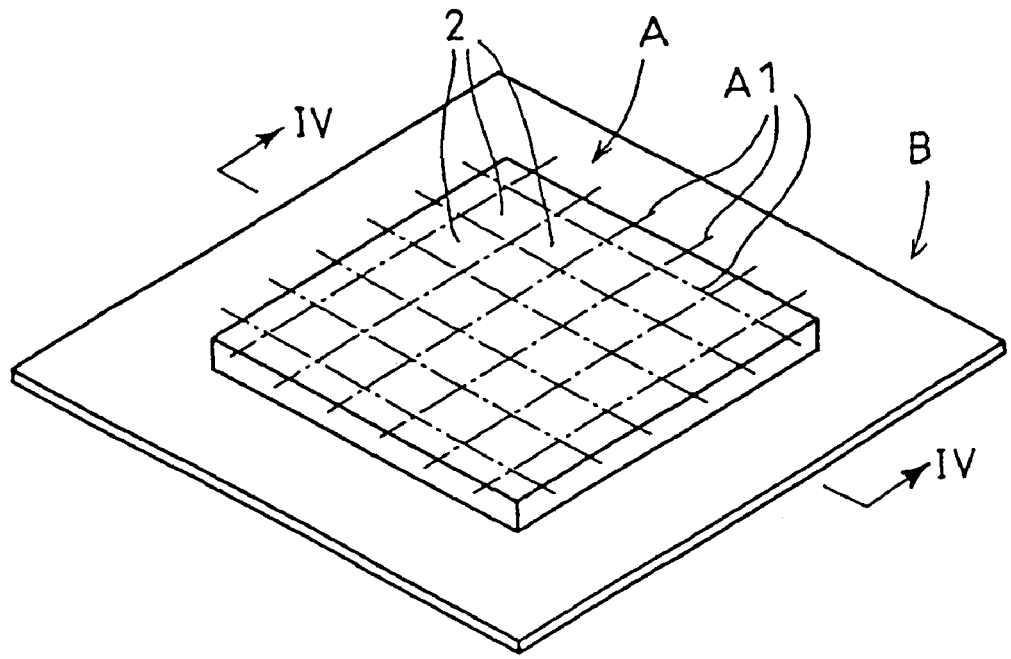
FIG. 3 is a perspective view showing an LED material plate bonded to an expansion sheet according to the first embodiment.
Figure 4:
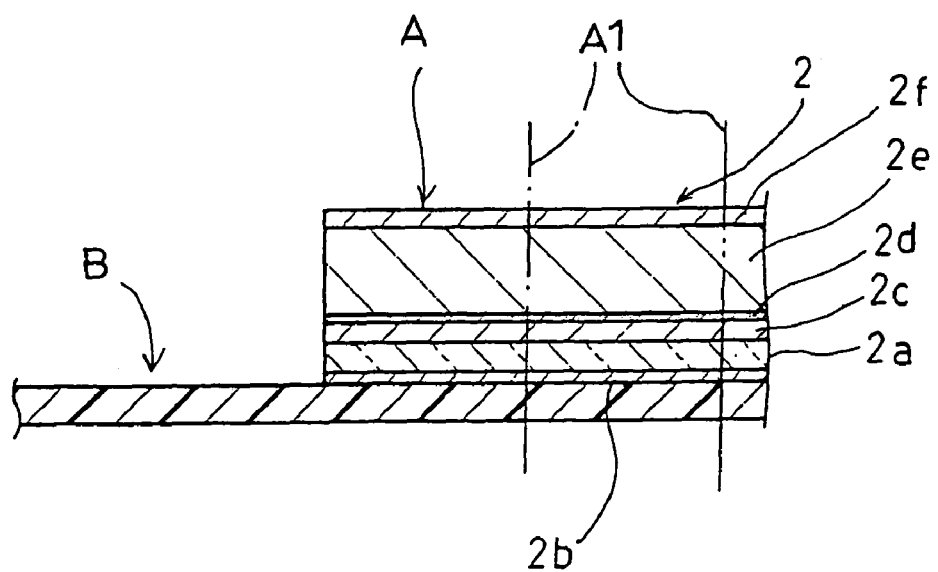
FIG. 4 is an enlarged sectional view taken along lines IV-IV in FIG. 3.

As shown in FIGS. 3 and 4, the LED material plate A is bonded to an upper surface of an expansion sheet B so that the cathode electrode $2b$ of the LED material plate A comes into close contact with the expansion sheet B.

Figure 5:
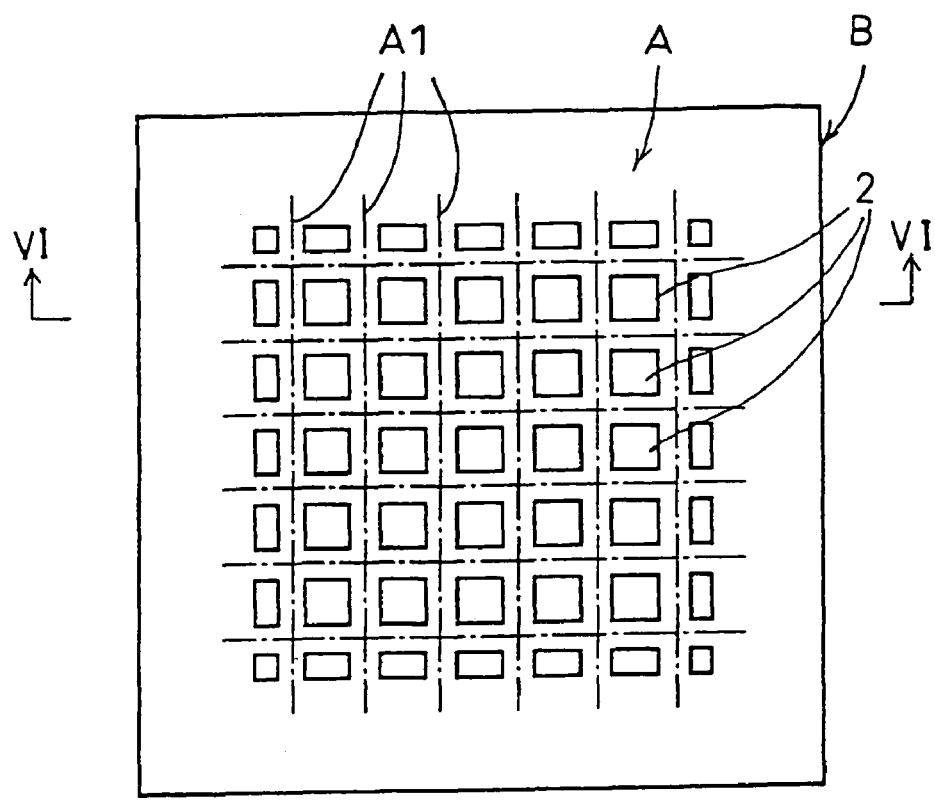
FIG. 5 is a plan view showing the LED material plate divided into individual LED chips according to the first embodiment.
Figure 6:
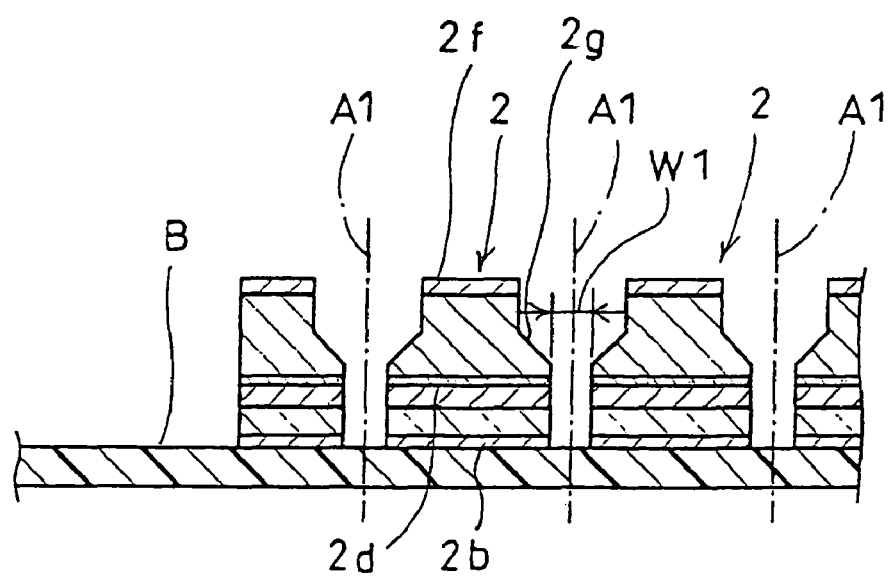
FIG. 6 is an enlarged sectional view taken along lines VI-VI in FIG. 5.

Subsequently, as shown in FIGS. 5 and 6, with the LED material plate A bonded to the expansion sheet B, the LED material plate A is diced along cutting lines A1 between the LED chips 2 by a cutting width W1 by using a non-illustrated dicing cutter, whereby the LED material plate A is divided into individual LED chips 2.

In the dicing, an inwardly inclined surface $2g$ is formed at a side surface of each LED chip 2 by using the dicing cutter.

Figure 7:
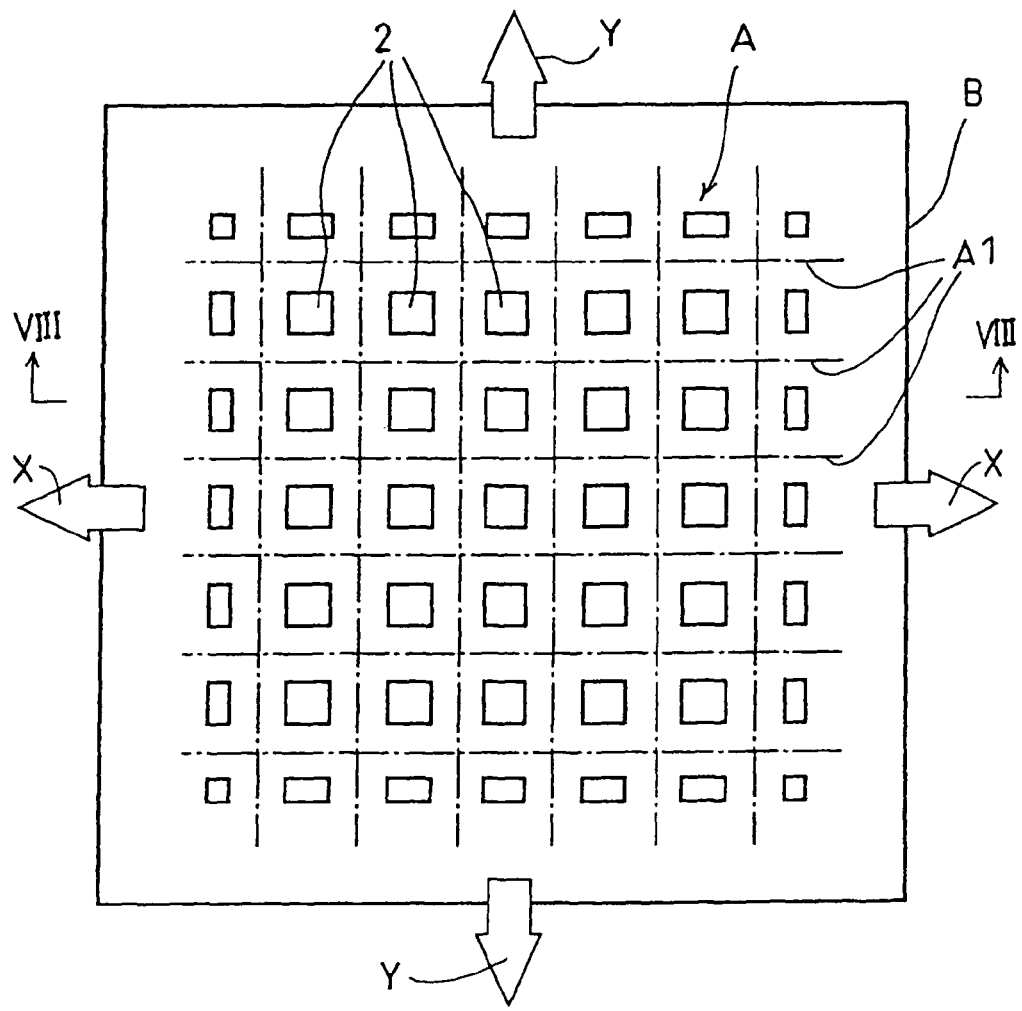
FIG. 7 is a plan view showing the expansion sheet which is stretched according to the first embodiment.
Figure 8:
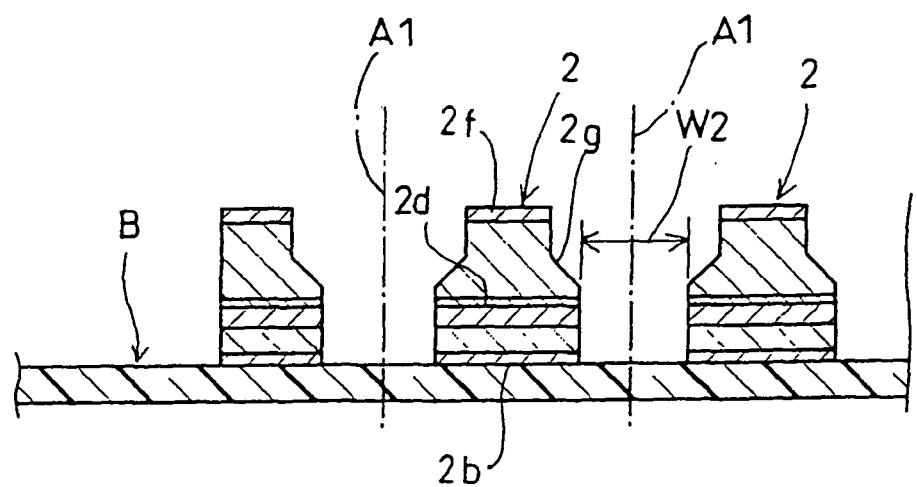
FIG. 8 is an enlarged sectional view taken along lines VIII-VIII in FIG. 7.

Subsequently, as shown in FIG. 7, with the LED chips 2 bonded to the upper surface of the expansion sheet B, the expansion sheet is stretched in X-axis direction and Y-axis direction which are perpendicular to each other along the surface, whereby the spacing W1 between adjacent LED chips 2 at the time of dicing is widened to W2.

Figure 9:
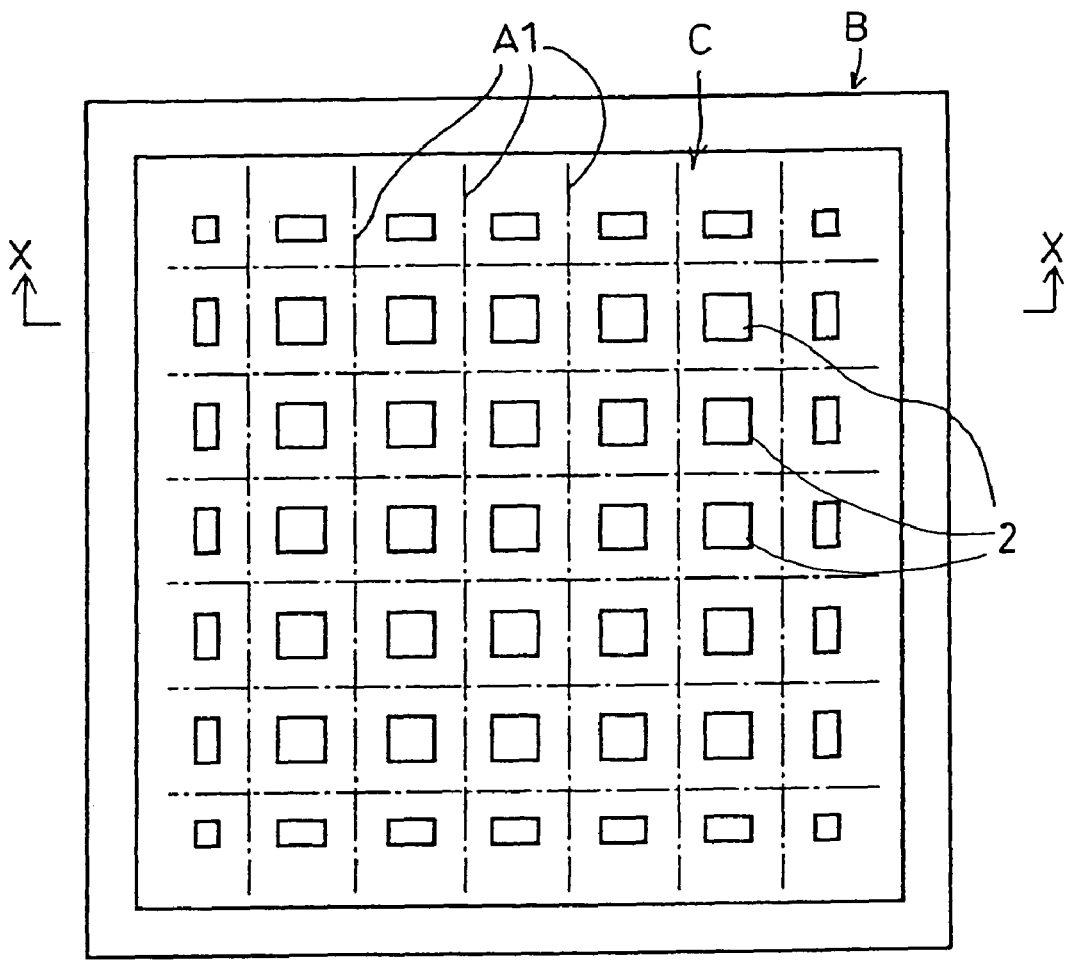
FIG. 9 is a plan view showing an expansion sheet on which a synthetic resin layer is formed according to the first embodiment.
Figure 10:
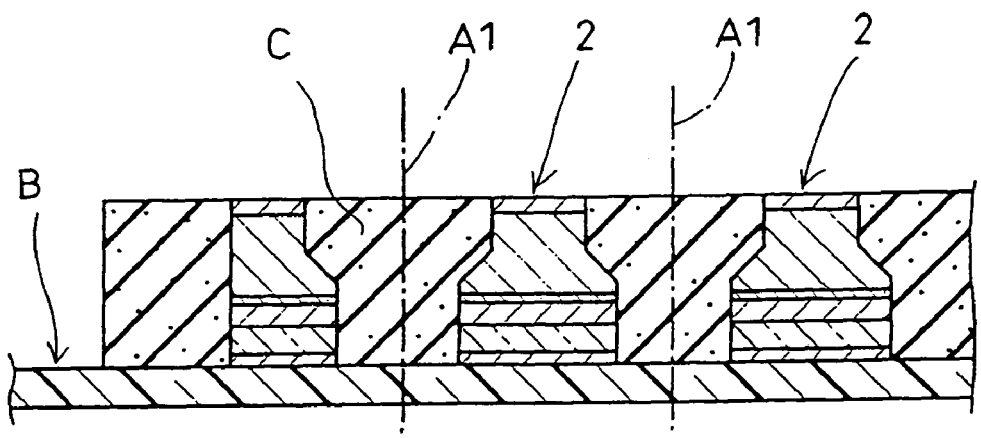
FIG. 10 is an enlarged sectional view taken along lines X-X in FIG. 9.

Subsequently, light-pervious synthetic resin in a liquid state in which a fluorescent material is mixed in advance is supplied to the upper surface of the expansion sheet B and then hardened. As a result, as shown in FIGS. 9 and 10, a synthetic resin layer C is formed. Thus, each of the LED chips 2 is embedded in the synthetic resin layer C except the anode electrode $2f$ provided at the upper surface of the LED chip.

Figure 11:
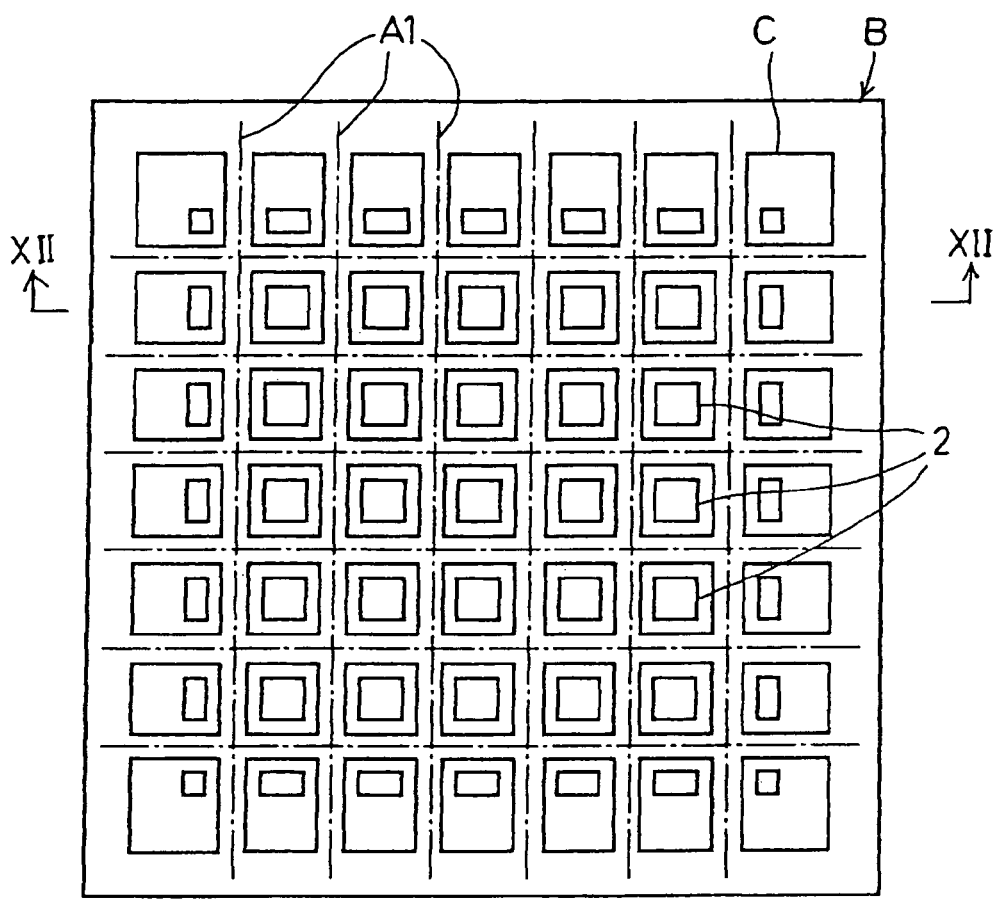
FIG. 11 is a plan view showing the synthetic resin layer divided into individual LED chips according to the first embodiment.
Figure 12:
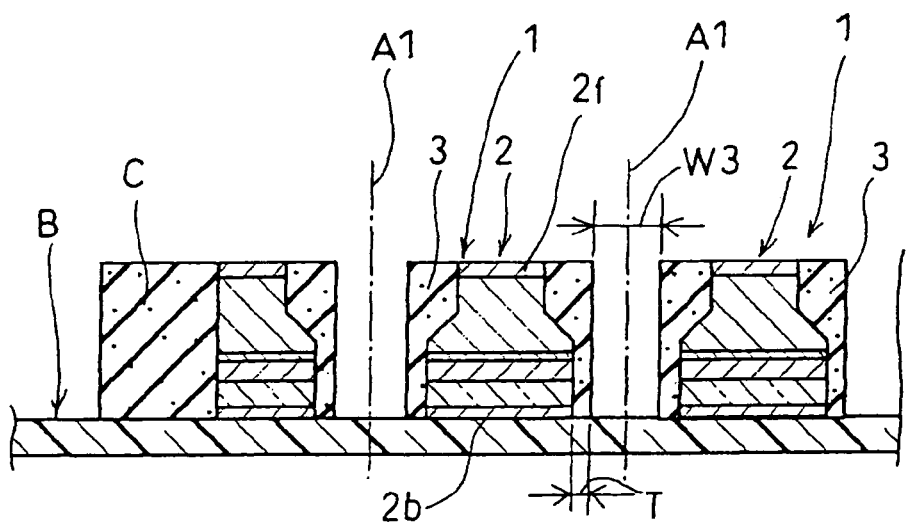
FIG. 12 is an enlarged sectional view taken along lines XII-XII in FIG. 11.

Then, as shown in FIGS. 11 and 12, the synthetic resin layer C is diced along cutting lines A1 between the LED chips 2 by a cutting width W3 by using a non-illustrated dicing cutter, whereby the synthetic resin layer C is divided into individual LED chips 2.

The cutting width W3 in the dicing of the synthetic resin layer C is smaller than the spacing distance W2 between adjacent LED chips 2 after the stretching of the expansion sheet B.

As a result, part of the synthetic resin layer C remains on each side surface of each of the LED chips 2, having a thickness T ($T=(W2-W3)\times\frac{1}{2}$) which is one half of the difference obtained by subtracting W3 from W2. In this way, the side surfaces of each LED chip 2 can be coated with the coating 3 of the light-pervious synthetic resin containing a fluorescent material.

Finally, each of the LED chips 2 is detached from the expansion sheet B, whereby the LED element 1 having the structure as shown in FIGS. 1 and 2 is obtained.

Figure 13:
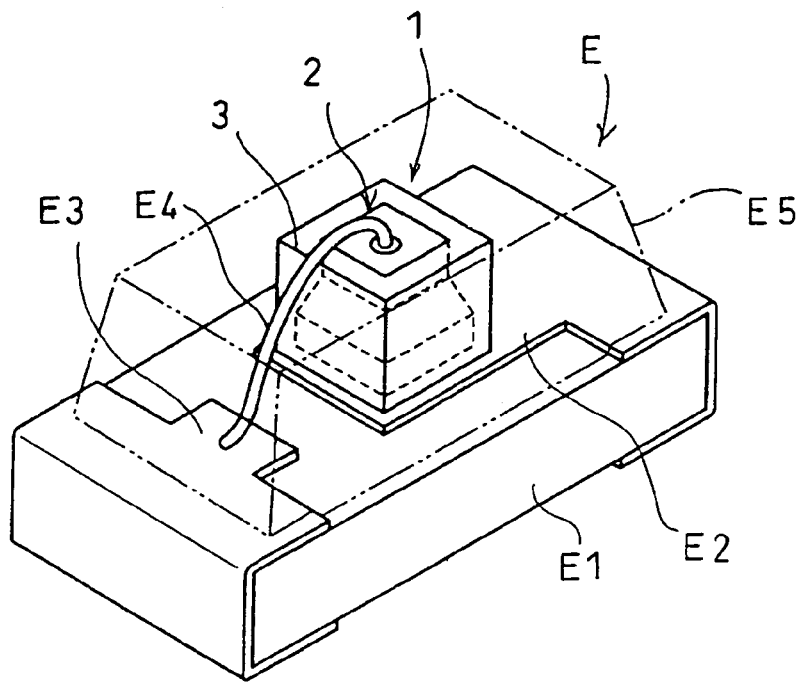
FIG. 13 is a perspective view showing an illuminator utilizing the LED according to the first embodiment.
Figure 14:
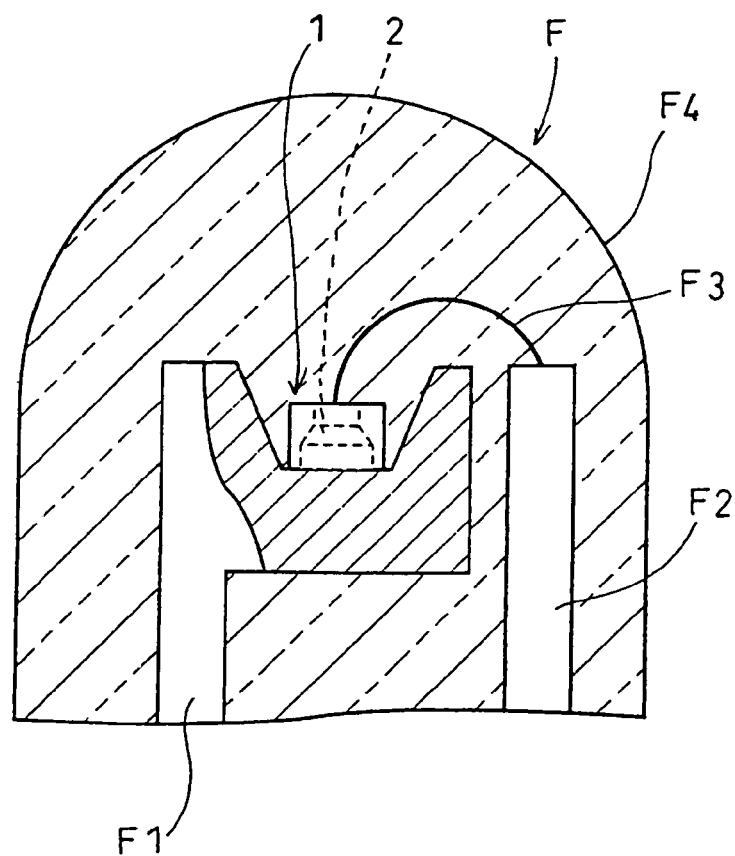
FIG. 14 is a vertical sectional view showing a lamp device utilizing the LED according to the first embodiment.

In the LED element 1 having such a structure, both of the anode electrode $2f$ and the cathode electrode $2b$ of the LED chip 2 are exposed. As shown in FIG. 13, such an LED may be mounted on a substrate E1 having an upper surface formed with a pair of wiring patterns E2 and E3 to provide an illuminator E. Specifically, in this case, the cathode electrode 2b of the LED element 1 is electrically connected to the wiring pattern E2, whereas the anode electrode 2f is electrically connected to the wiring pattern E3 by wire bonding of a thin metal wire E4, for example. (In the illuminator E, as indicated by two-dot chain lines, the LED element 1 on the upper surface of the substrate E1 may be sealed in a package body E5 made of a light-pervious synthetic resin.) Alternatively, as shown in FIG. 14, the LED may be utilized to provide a lamp device F. Specifically, in this case, of a pair of lead terminals F1 and F2, the LED element 1 is mounted to the lead terminal F1, i.e. in a recess formed at the end of the lead terminal F1 so that the cathode electrode 2b of the LED element 1 is electrically connected to the lead terminal F1. The anode electrode 2f and the other lead terminal F2 are electrically connected to each other by wire bonding of a thin metal wire F3, for example. These parts are entirely sealed in a lens body F4 made of a light-pervious synthetic resin, whereby the lamp device is provided.

In the first embodiment described above, the LED material plate A may be bonded to the expansion sheet B downwardly, i.e. in the orientation opposite from the above so that the anode electrode 2f of each LED chip 2 comes into close contact with the expansion sheet B.

FIGS. 15-21 show a second embodiment of the present invention.

Figure 15:
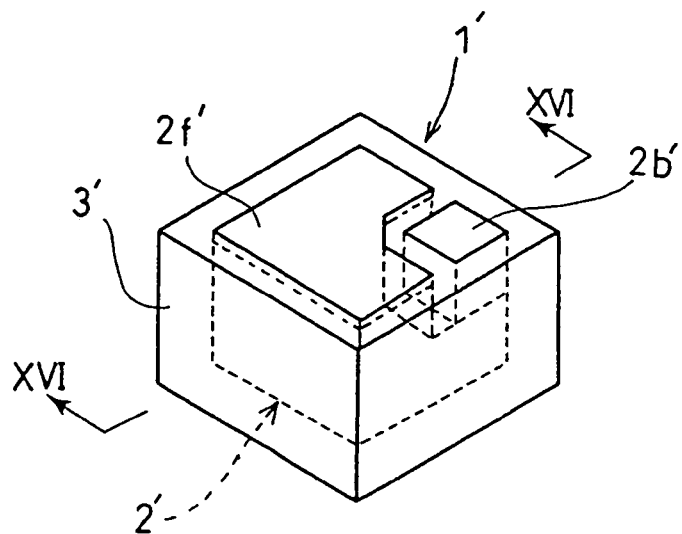
FIG. 15 is a perspective view showing an LED according to a second embodiment.
Figure 16:
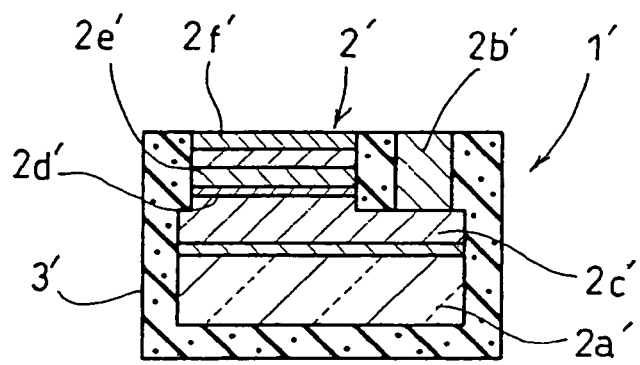
FIG. 16 is a sectional view taken along lines XVI-XVI in FIG. 15.

Of these figures, FIGS. 15 and 16 show a light-emitting diode element 1' to be manufactured in the second embodiment.

The LED element 1' includes an LED chip 2' having an end surface at which both of an anode electrode 2f' and a cathode electrode 2b' are provided. The entirety of the LED chip 2' except the end surface provided with the anode electrode 2f' and the cathode electrode 2b' is coated with a coating 3' of a light-pervious synthetic resin containing a fluorescent material.

As is conventionally known, the LED chip 2' includes at least a transparent substrate 2a' made of e.g. sapphire and having a surface on which are stacked an n-type semiconductor layer 2c', a light-emitting layer 2d' for emitting blue light, a p-type semiconductor layer 2e', the cathode electrode 2b' for the n-type semiconductor layer 2c', and the anode electrode 2f' for the p-type semiconductor layer 2e'.

In the LED element 1' having the above structure, since the entirety of the LED chip 2' except one end surface is coated with the coating 3' made of a light-pervious synthetic resin containing a fluorescent material, the blue light emitted from the light-emitting layer 2d' of the LED chip 2' is subjected to wavelength conversion by the fluorescent material in the coating and emitted to the outside as white light.

The substrate 2a' of the LED chip 2' may be opaque. In such a case, the coating 3' need not be provided on the reverse surface of the substrate 2a', and similarly to the first embodiment, only the side surfaces of the LED chip 2' need be coated with the coating 3'.

Similarly to the first embodiment, the LED element 1' having the above structure is manufactured by the following method.

Figure 17:
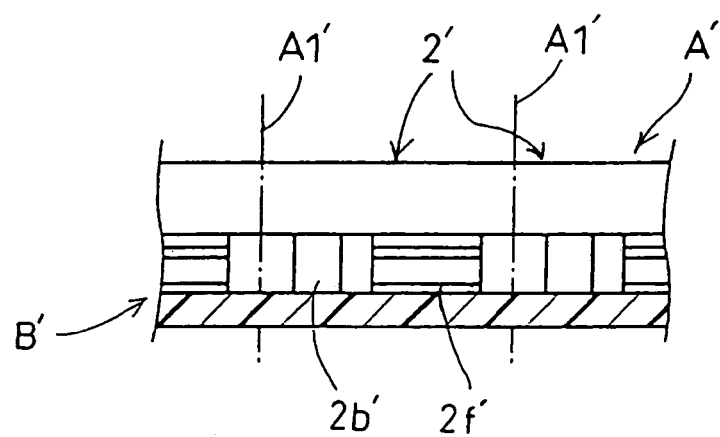
FIG. 17 is a sectional view showing an LED material plate bonded to an expansion sheet according to the second embodiment.

First, an integral LED material plate A' is prepared which corresponds to a plurality of LED chips 2' having the above-described structure. As shown in FIG. 17, the LED material plate A' is bonded to an upper surface of an expansion sheet B' so that the cathode electrode 2b' and the anode electrode 2f' of the LED material plate A' come into close contact with the expansion sheet B'.

Figure 18:
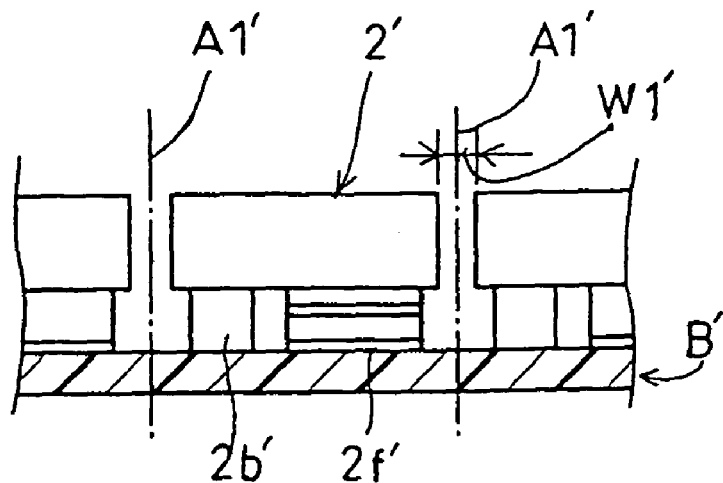
FIG. 18 is a sectional view showing the LED material plate divided into individual LED chips according to the second embodiment.

Subsequently, as shown in FIG. 18, with the LED material plate A' bonded to the expansion sheet B', the LED material plate A' is diced along cutting lines A1' between the LED chips 2' by a cutting width W1' by using a non-illustrated dicing cutter, whereby the LED material plate A' is divided into individual LED chips 2'.

Figure 19:
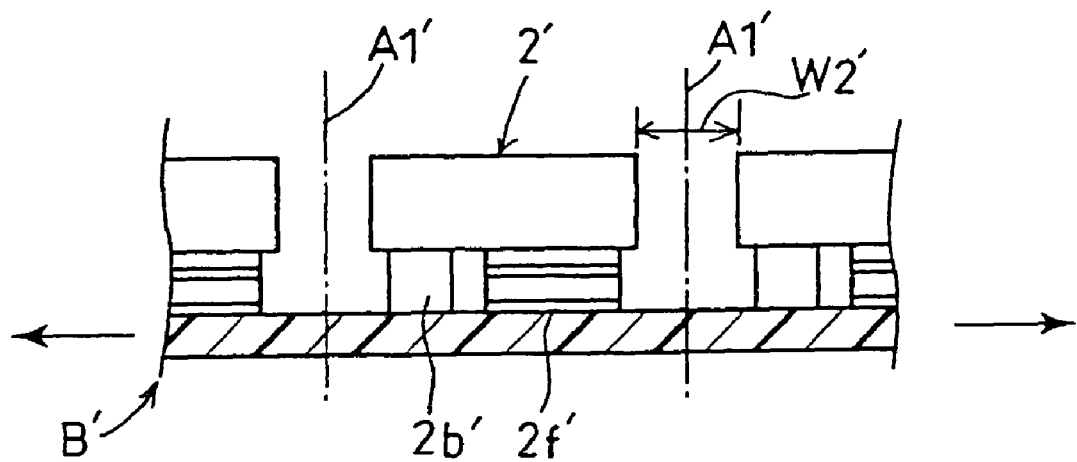
FIG. 19 is a sectional view showing the expansion sheet which is stretched according to the second embodiment.

Subsequently, as shown in FIG. 19, with the LED chips 2' bonded to the upper surface of the expansion sheet B', the expansion sheet is stretched in X-axis direction and Y-axis direction which are perpendicular to each other along the surface, whereby the spacing W1' between adjacent LED chips 2 at the time of dicing is widened to W2'.

Figure 20:
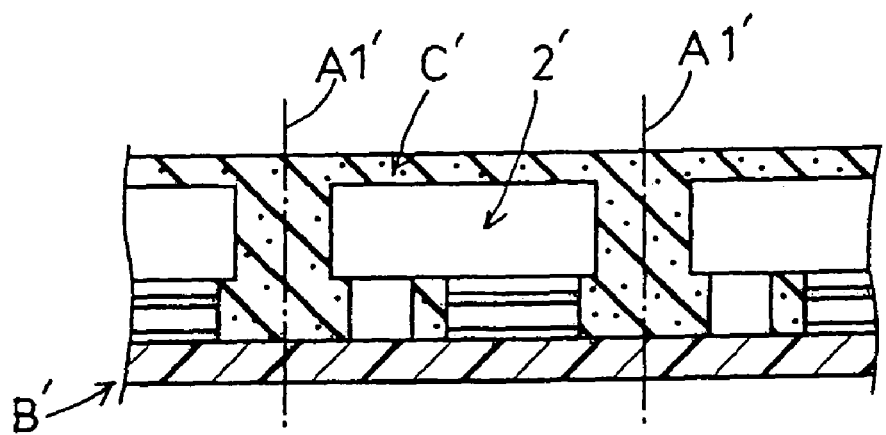
FIG. 20 is a sectional view showing an expansion sheet on which a synthetic resin layer is formed according to the second embodiment.

Subsequently, light-pervious synthetic resin in a liquid state in which a fluorescent material is mixed in advance is supplied to the upper surface of the expansion sheet B' and then hardened. As a result, as shown in FIG. 20, a synthetic resin layer C' is formed. Thus, each of the LED chips 2' is entirely embedded in the synthetic resin layer C'.

It is to be noted that, when the substrate 2a of the LED chip 2' is opaque, the LED chip 2' is embedded except the portion of the anode electrode 2f at the upper surface.

Figure 21:
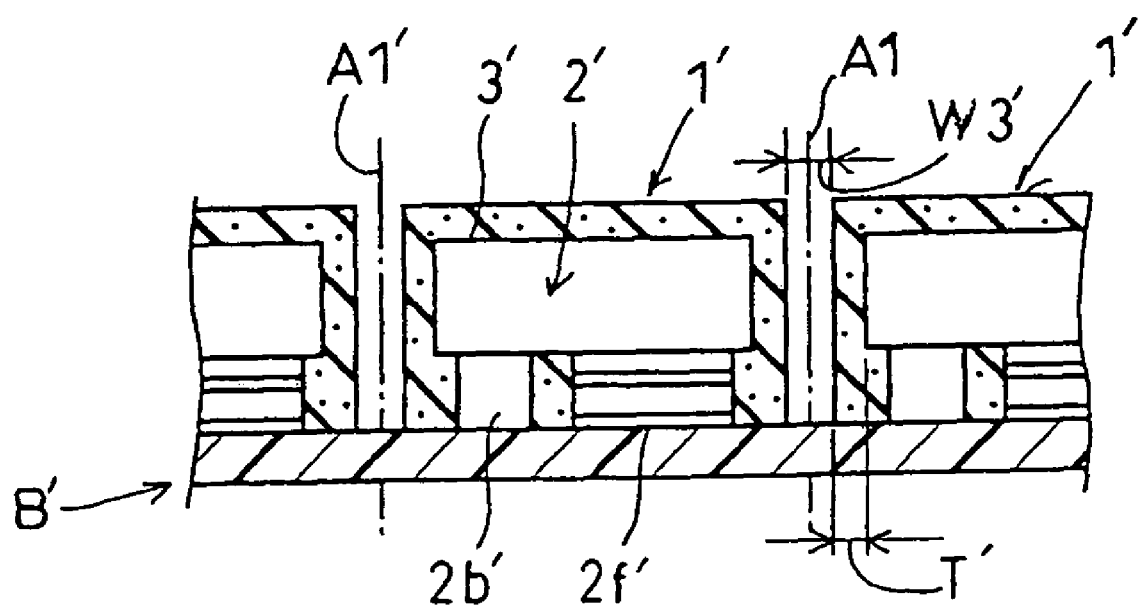
FIG. 21 is a plan view showing the synthetic resin layer divided into individual LED chips according to the second embodiment.

Then, as shown in FIG. 21, the synthetic resin layer C' is diced along cutting lines A1' between the LED chips 2' by a cutting width W3' by using a non-illustrated dicing cutter, whereby the synthetic resin layer C' is divided into individual LED chips 2'.

The cutting width W3' in the dicing of the synthetic resin layer C' is smaller than the spacing distance W2' between adjacent LED chips 2' after the stretching of the expansion sheet B'.

As a result, part of the synthetic resin layer C' remains on each side surface of each of the LED chips 2, having a thickness T' (T'=(W2'-W3')×½) which is one half of the difference obtained by subtracting W3' from W2'. In this way, the side surfaces of each LED chip 2' can be coated with the coating 3' of the light-pervious synthetic resin containing a fluorescent material.

Finally, each of the LED chips 2' is detached from the expansion sheet B', whereby the LED element 1' having the structure as shown in FIGS. 15 and 16 is obtained.

The LED element 1' according to the second embodiment can also be used for the illuminator shown in FIG. 13 or the lamp device shown in FIG. 14.

The invention claimed is:

1. A method for manufacturing a white light-emitting diode element, the method comprising the steps of:
    preparing an integral LED material plate corresponding to a plurality of LED chips each of which includes an anode and a cathode electrodes for a blue light-emitting layer, the anode electrode and the cathode electrode being provided respectively at opposite end surfaces of the chip;
    bonding the LED material plate to an upper surface of an expansion sheet so that at least either of the cathode electrode and the anode electrode comes into close contact with the expansion sheet;
    dicing the LED material plate into individual LED chips while the LED material plate is bonded to the expansion sheet;
    putting the expansion sheet into a stretched state to be extended in two directions which are perpendicular to each other along a surface so that a spacing between adjacent LED chips is widened;

forming a light-pervious synthetic resin layer containing a fluorescent material on the upper surface of the expansion sheet in the stretched state so that each of the LED chips is embedded in the synthetic resin layer up to the electrode on an upper surface of the LED chip;

dicing the synthetic resin layer to remove portions of the synthetic resin layer between adjacent LED chips by a cutting width which is smaller than the spacing distance between side surfaces of adjacent LED chips, the dicing being performed with the LED chips attached to the expansion sheet; and detaching the LED chips from the expansion sheet.

2. The method for manufacturing a white light-emitting diode element according to claim 1, wherein the dicing of the LED material plate into individual LED chips comprises forming an inclined surface at a side surface of each of the LED chips, the inclined surface being inclined from one electrode film toward the other electrode film.

3. The method for manufacturing a white light-emitting diode element according to claim 1, wherein each of the LED chips includes a light reflective layer on an upper side of the light-emitting layer.

4. A method for manufacturing a white light-emitting diode element, the method comprising the steps of:

preparing an integral LED material plate corresponding to a plurality of LED chips each of which includes an anode and a cathode electrodes for a blue light-emitting layer, the anode electrode and the cathode electrode being provided at an end surface of the LED chip;

bonding the LED material plate to an upper surface of an expansion sheet so that the cathode electrode and the anode electrode come into close contact with the expansion sheet;

dicing the LED material plate into individual LED chips while the LED material plate is bonded to the expansion sheet;

putting the expansion sheet into a stretched state to be extended in two directions which are perpendicular to each other along a surface so that a spacing between adjacent LED chips is widened;

forming a light-pervious synthetic resin layer containing a fluorescent material on the upper surface of the expansion sheet in the stretched state so that each of the LED chips is embedded in the synthetic resin layer at least up to a side surface;

dicing the synthetic resin layer to remove portions of the synthetic resin layer between adjacent LED chips by a cutting width which is smaller than the spacing distance between side surfaces of adjacent LED chips, the dicing being performed with the LED chips attached to the expansion sheet; and detaching the LED chips from the expansion sheet.

* * * * *